(12) United States Patent
Gutsche et al.

(10) Patent No.: US 7,112,487 B2
(45) Date of Patent: Sep. 26, 2006

(54) METHOD FOR FABRICATING A STACKED CAPACITOR ARRAY HAVING A REGULAR ARRANGEMENT OF A PLURALITY OF STACKED CAPACITORS

(75) Inventors: Martin Gutsche, Dorfen (DE); Harald Seidl, Pöriing (DE)

(73) Assignee: Infineon Technologies AG, Munich (DE)

( * ) Notice: Subject to any disclaimer, the term of this patent is extended or adjusted under 35 U.S.C. 154(b) by 2 days.

(21) Appl. No.: 11/079,131

(22) Filed: Mar. 14, 2005

(65) Prior Publication Data
US 2005/0245027 A1 Nov. 3, 2005

(30) Foreign Application Priority Data
Apr. 30, 2004 (DE) ............ 10 2004 021 399

(51) Int. Cl.
*H01L 21/8242* (2006.01)
(52) U.S. Cl. ............... 438/253; 438/254; 438/396
(58) Field of Classification Search ........ 438/238–240, 438/253–256, 381, 396–399
See application file for complete search history.

(56) References Cited

U.S. PATENT DOCUMENTS

| | | | |
|---|---|---|---|
| 6,667,209 B1 * | 12/2003 | Won et al. ............ | 438/253 |
| 2002/0149043 A1 | 10/2002 | Willer et al. | |
| 2003/0001180 A1 | 1/2003 | Narimatsu et al. | |

FOREIGN PATENT DOCUMENTS

DE 199050364 4/2001

JP 10212868 1/2003

* cited by examiner

*Primary Examiner*—H. Jey Tsai
(74) *Attorney, Agent, or Firm*—Jenkins, Wilson, Taylor & Hunt, P.A.

(57) ABSTRACT

The present invention provides a method for fabricating a stacked capacitor array (1), which comprises a regular arrangement of a plurality of stacked capacitors (2), with a stacked capacitor (2) being at a shorter distance from the respective adjacent stacked capacitor (2) in certain first directions (3) than in certain second directions (4), comprising the following method steps: provision of an auxiliary layer stack (5) having first auxiliary layers (6) with a predetermined etching rate and at least one second auxiliary layer (7) with a higher etching rate on a substrate (8); etching of in each case one hollow cylinder (9) for each stacked capacitor (2) through the auxiliary layer stack (5) in accordance with the regular arrangement, with the auxiliary layer stack (5) being left in place in intermediate regions (10) between the hollow cylinders (9); isotropic etching of the second auxiliary layers (7) to form widened portions (11) of the hollow cylinders (9), without any second auxiliary layer (7) being left in place between in each case two hollow cylinders (9) which adjoin one another in the first direction (3) and with a second residual auxiliary layer (7a) being left in place between in each case two hollow cylinders (9) which adjoin one another in the second direction (4); conformal deposition of an insulator layer (12) in order to completely fill the widened portions (11); deposition of a first electrode layer (13) in the hollow cylinders (9) in order to form the stacked capacitors (2); filling of the hollow cylinders (9) with a first filling (14); removal of the first auxiliary layers (6), the second residual auxiliary layers (7a) and the first filling (14) and completion of the stacked capacitor array (1).

13 Claims, 20 Drawing Sheets

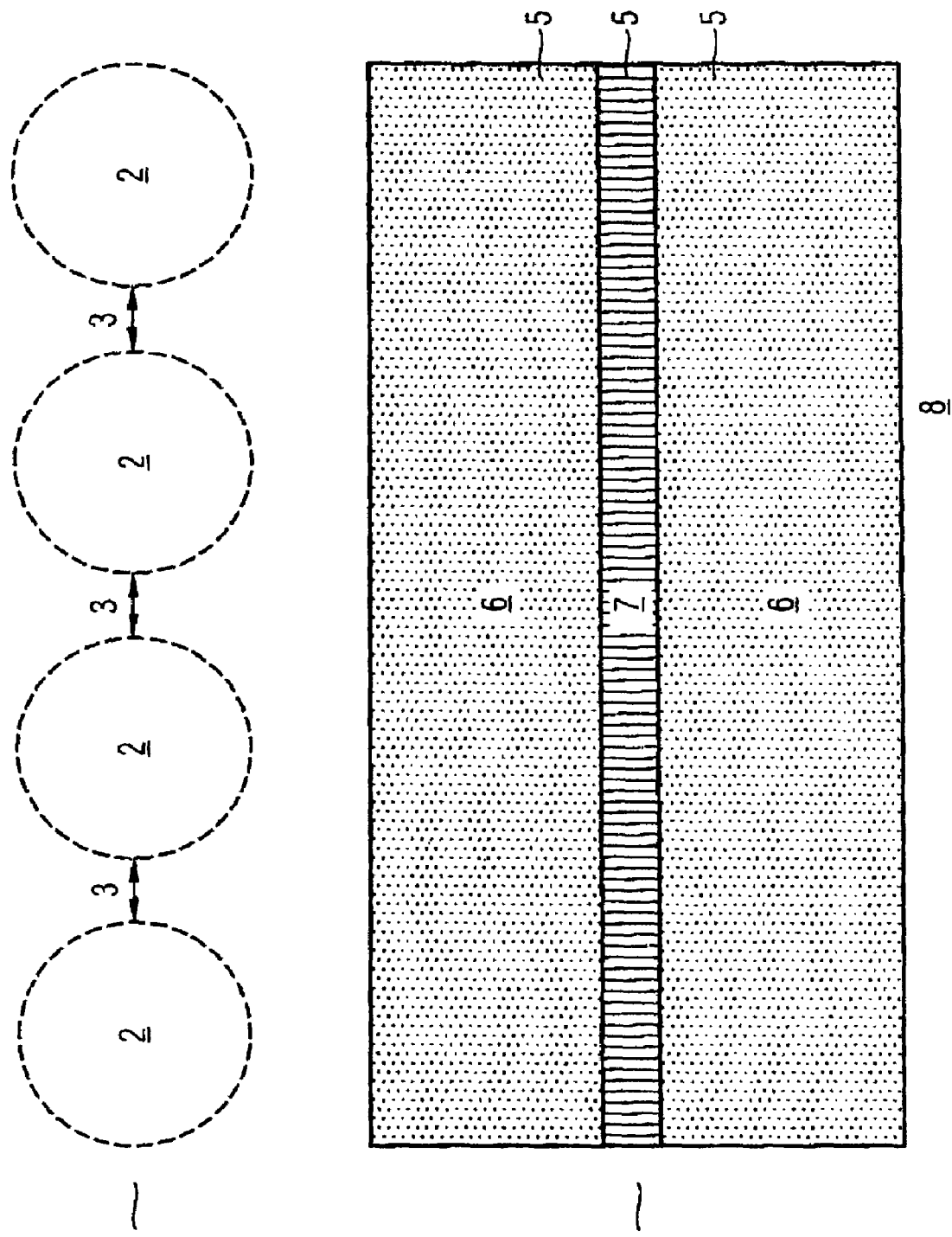

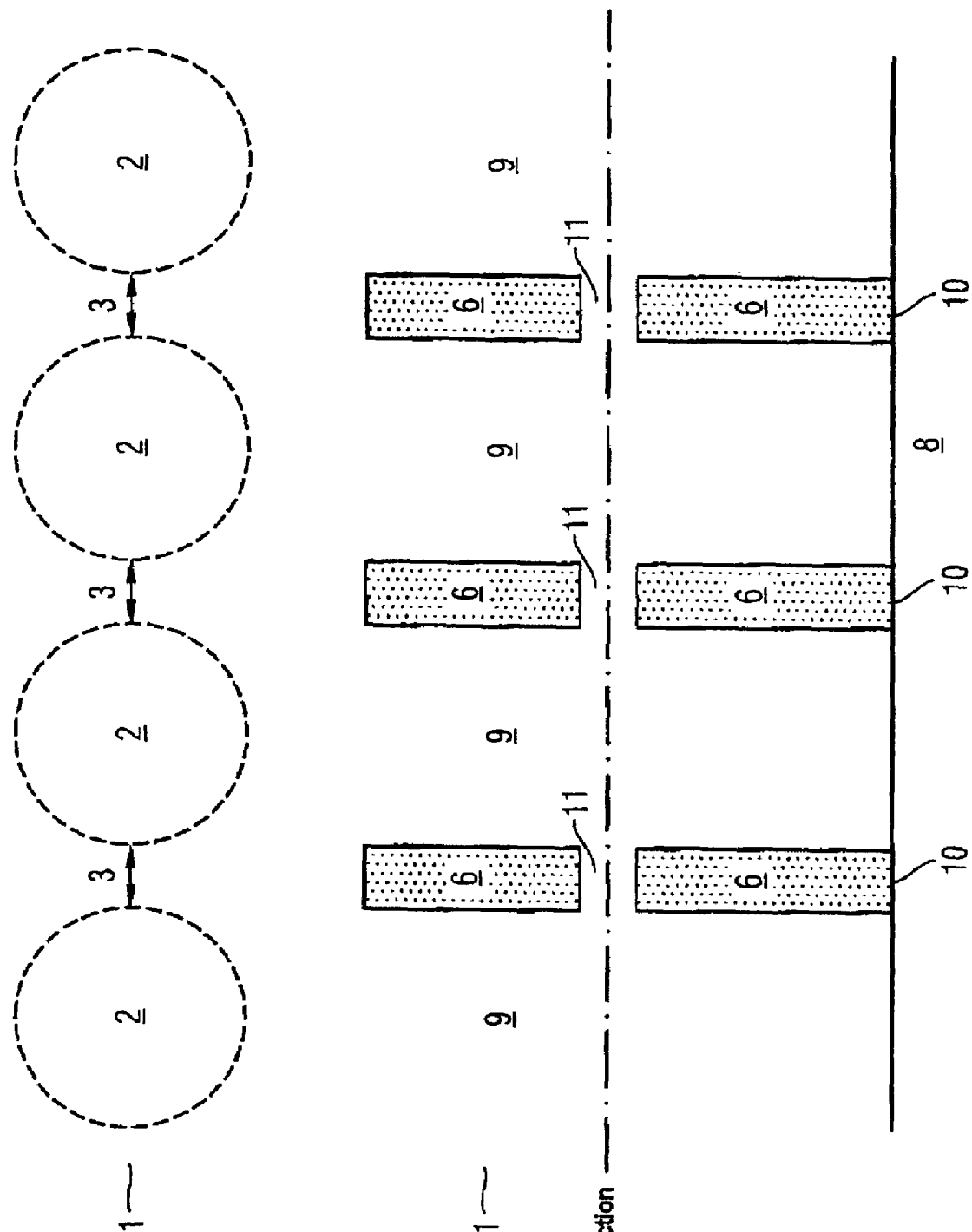

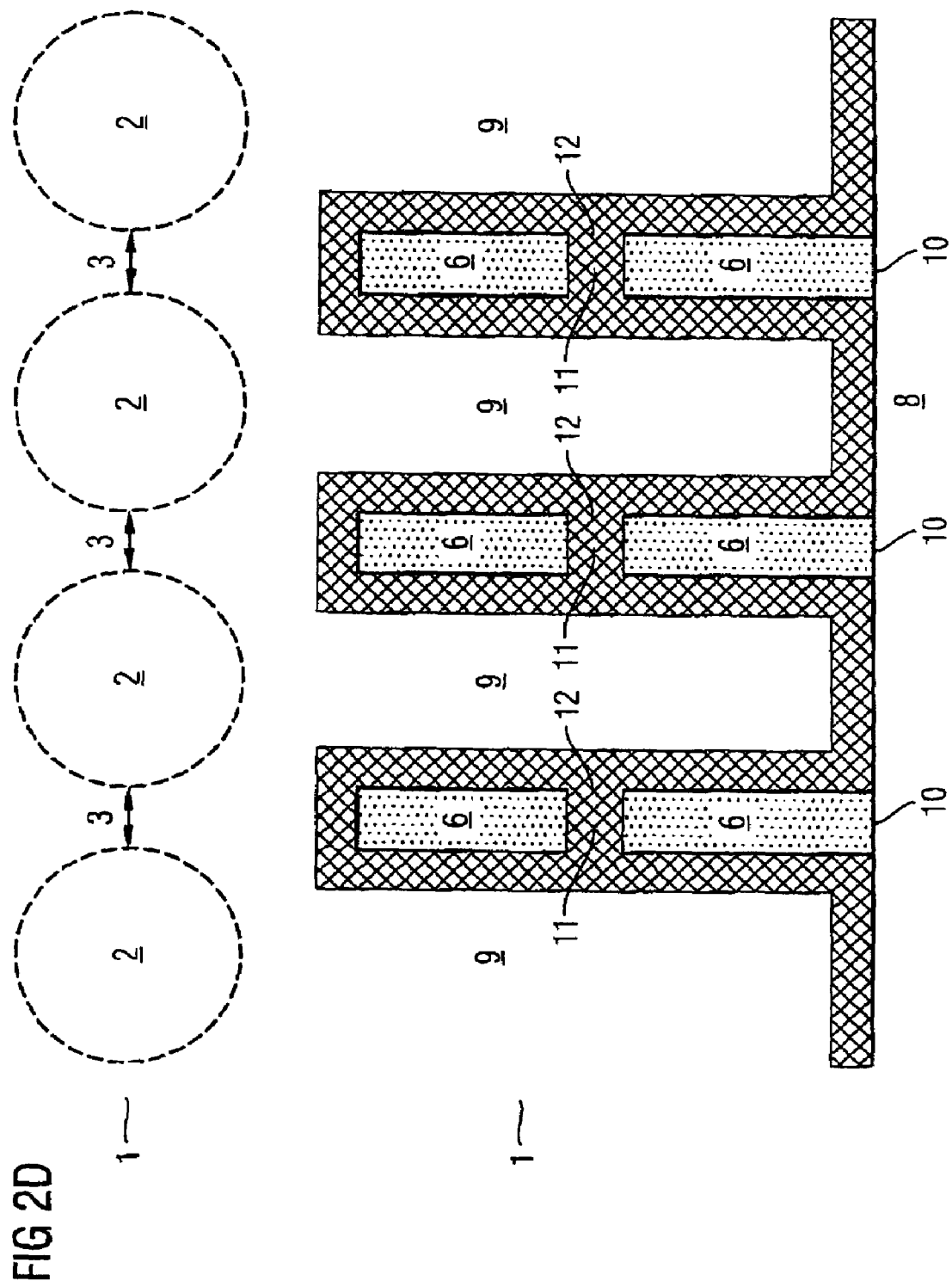

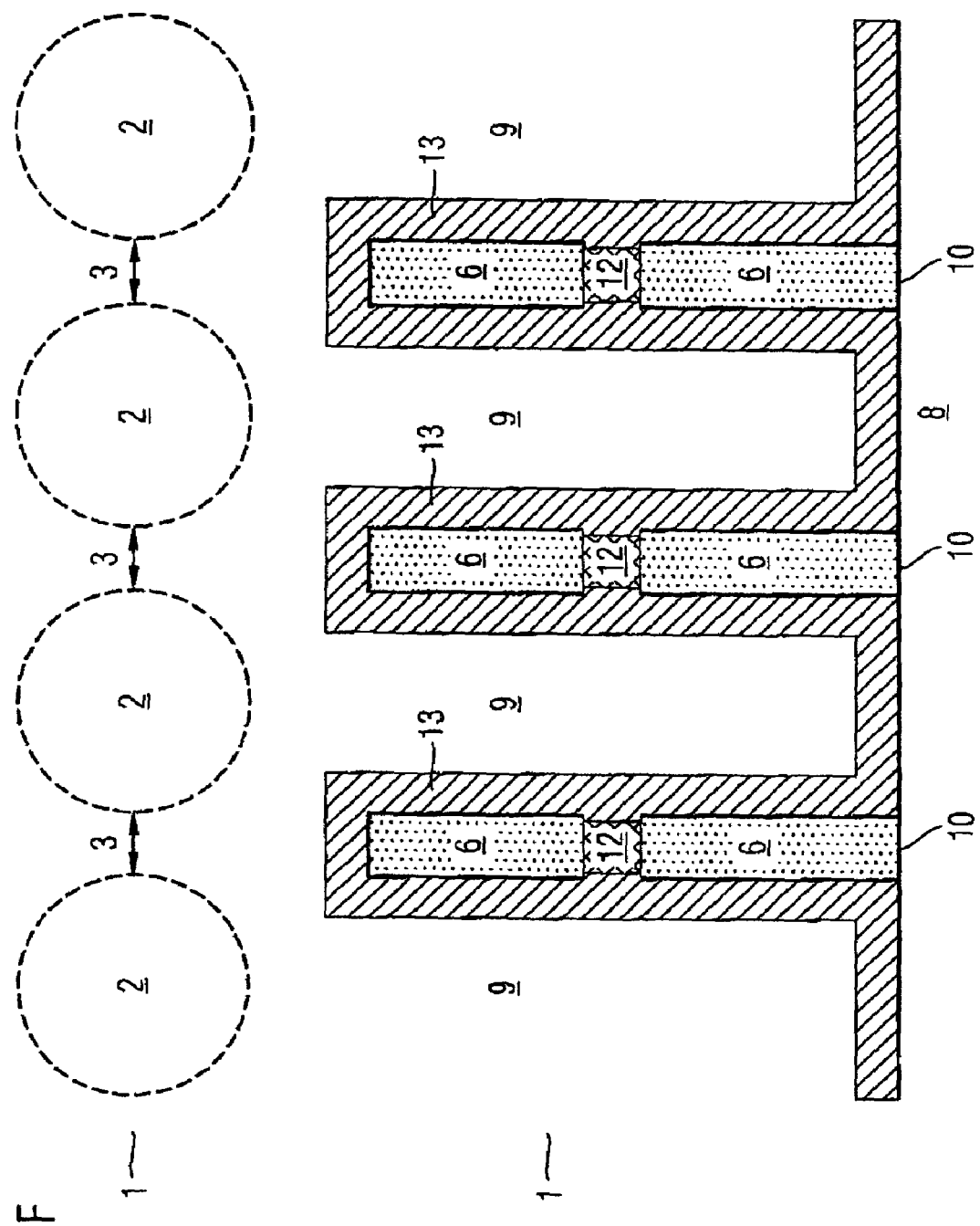

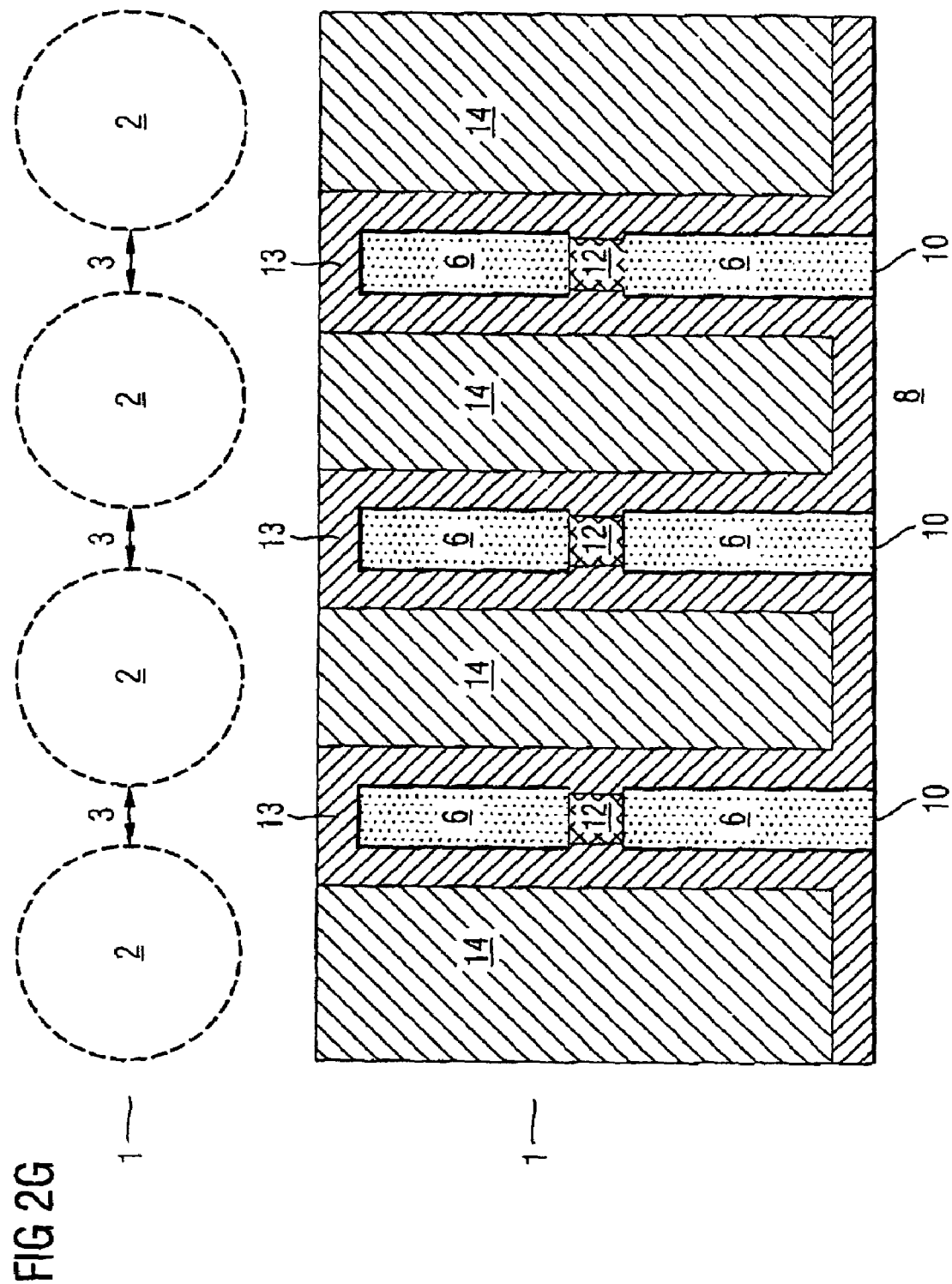

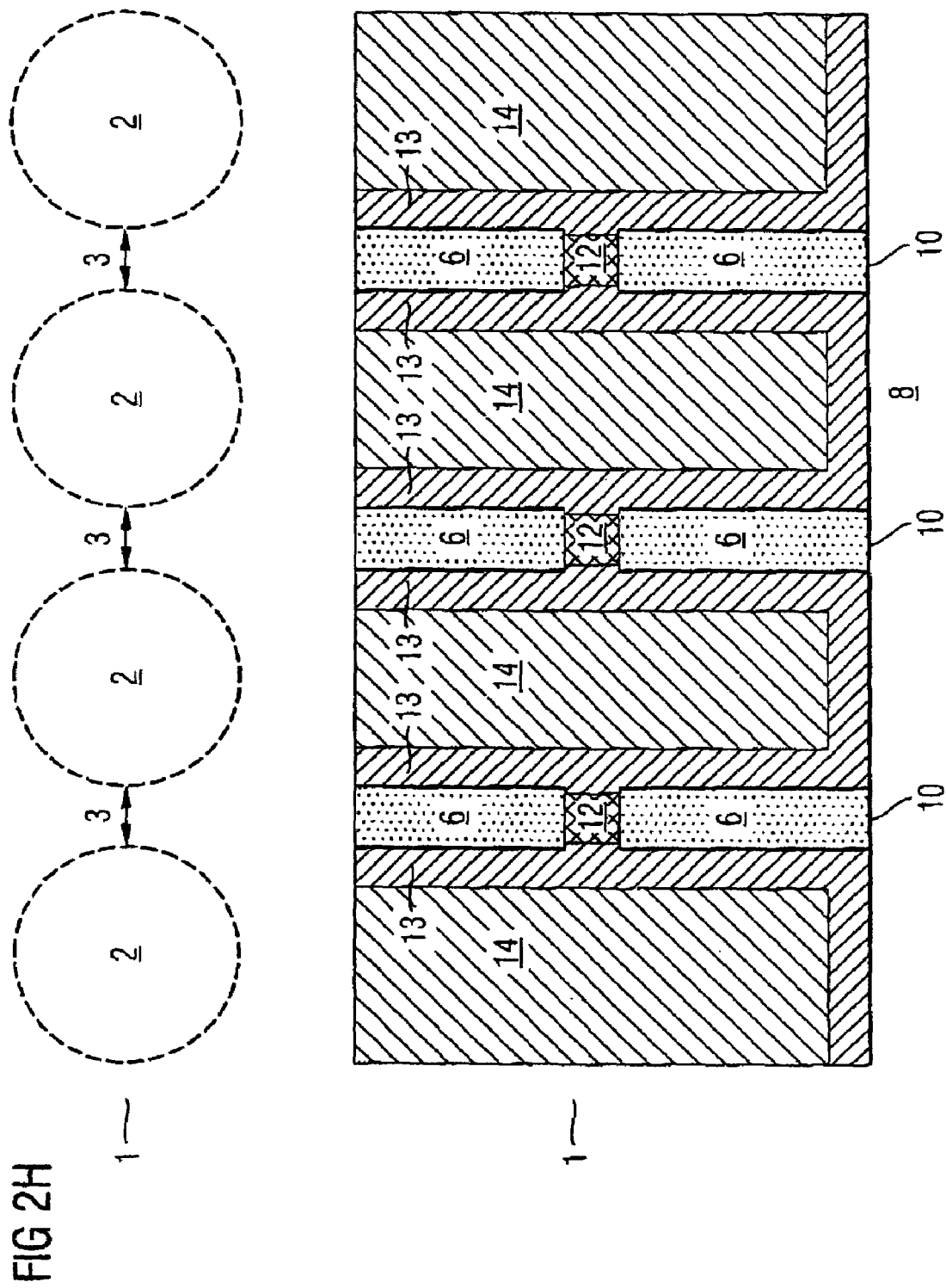

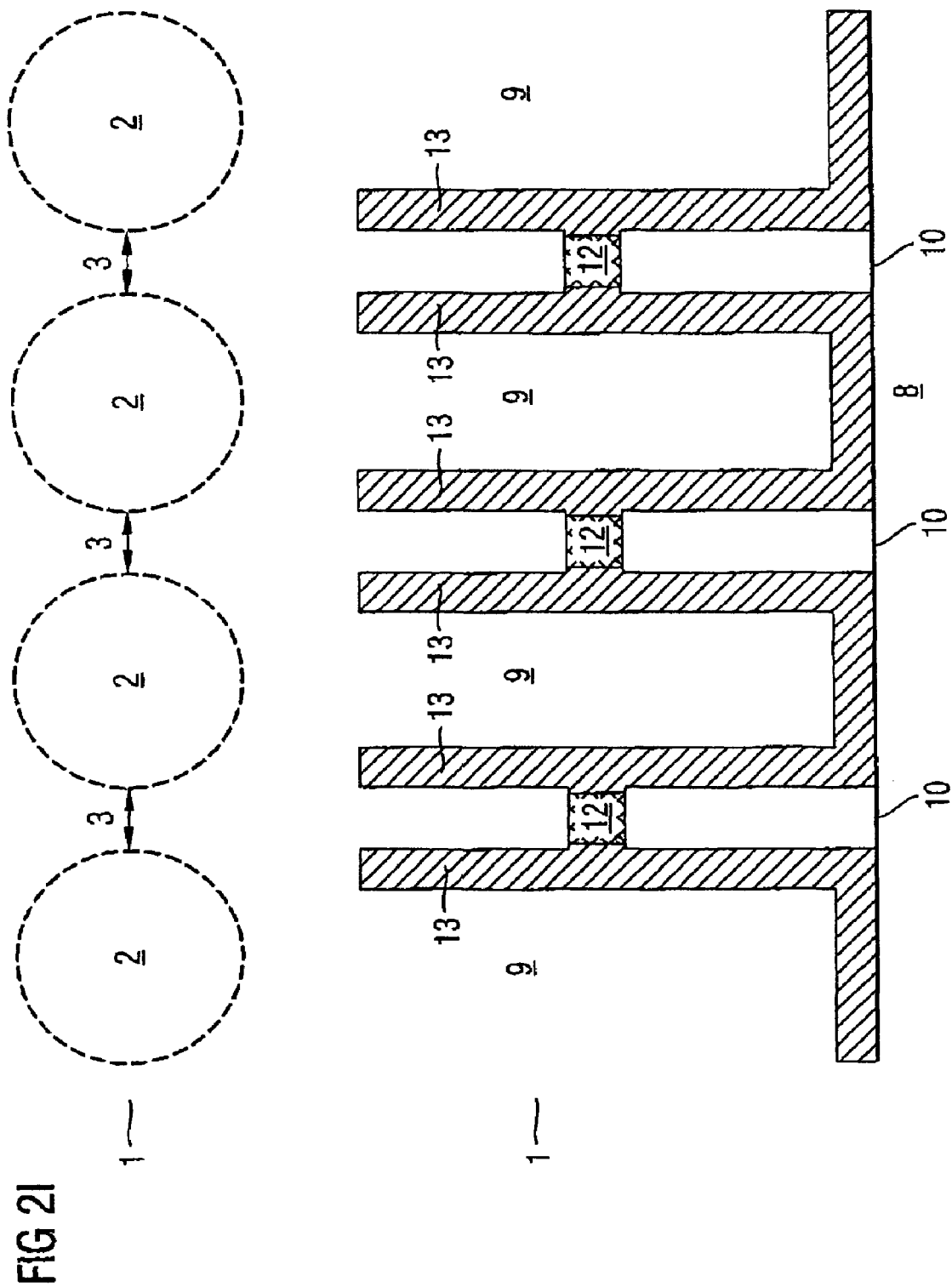

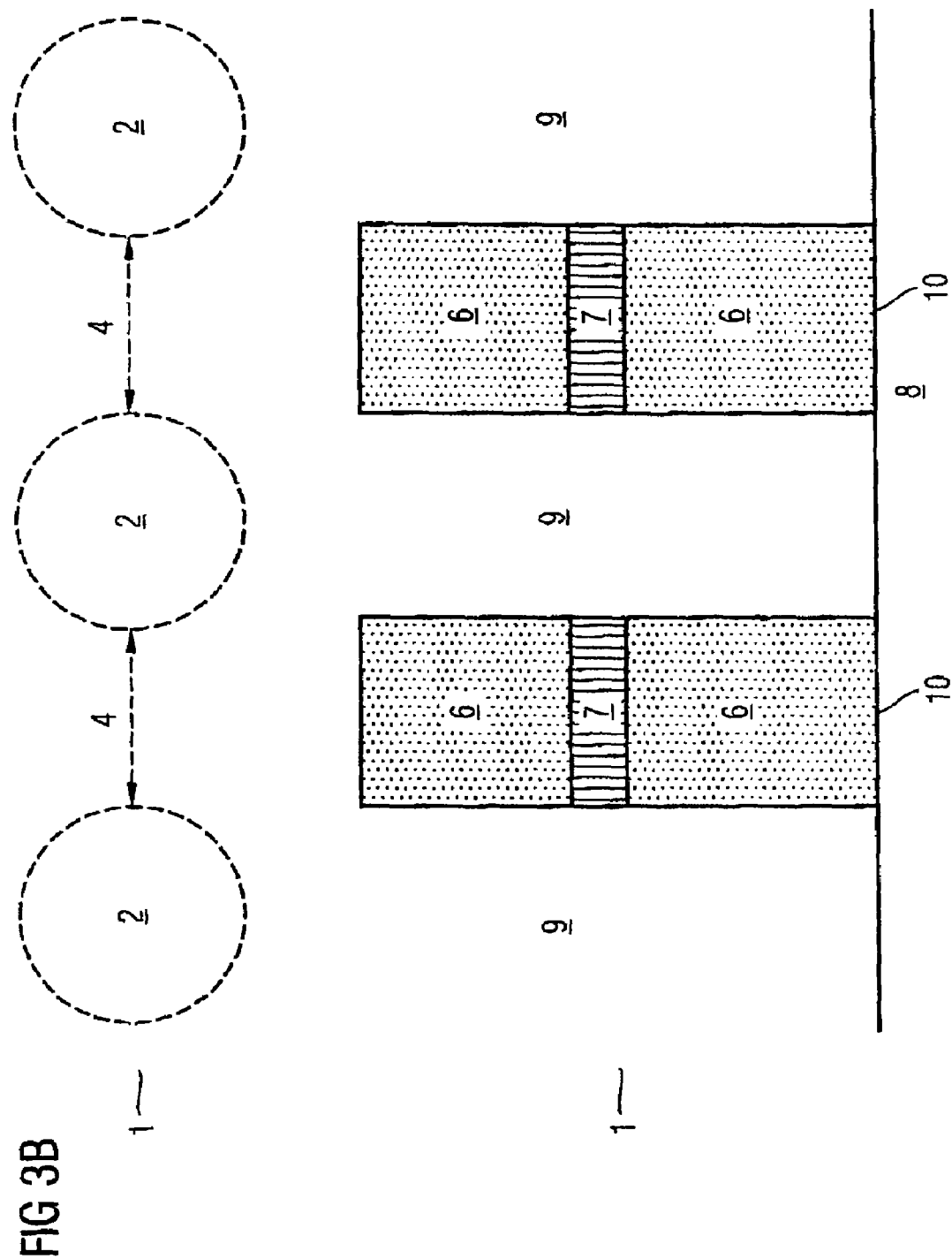

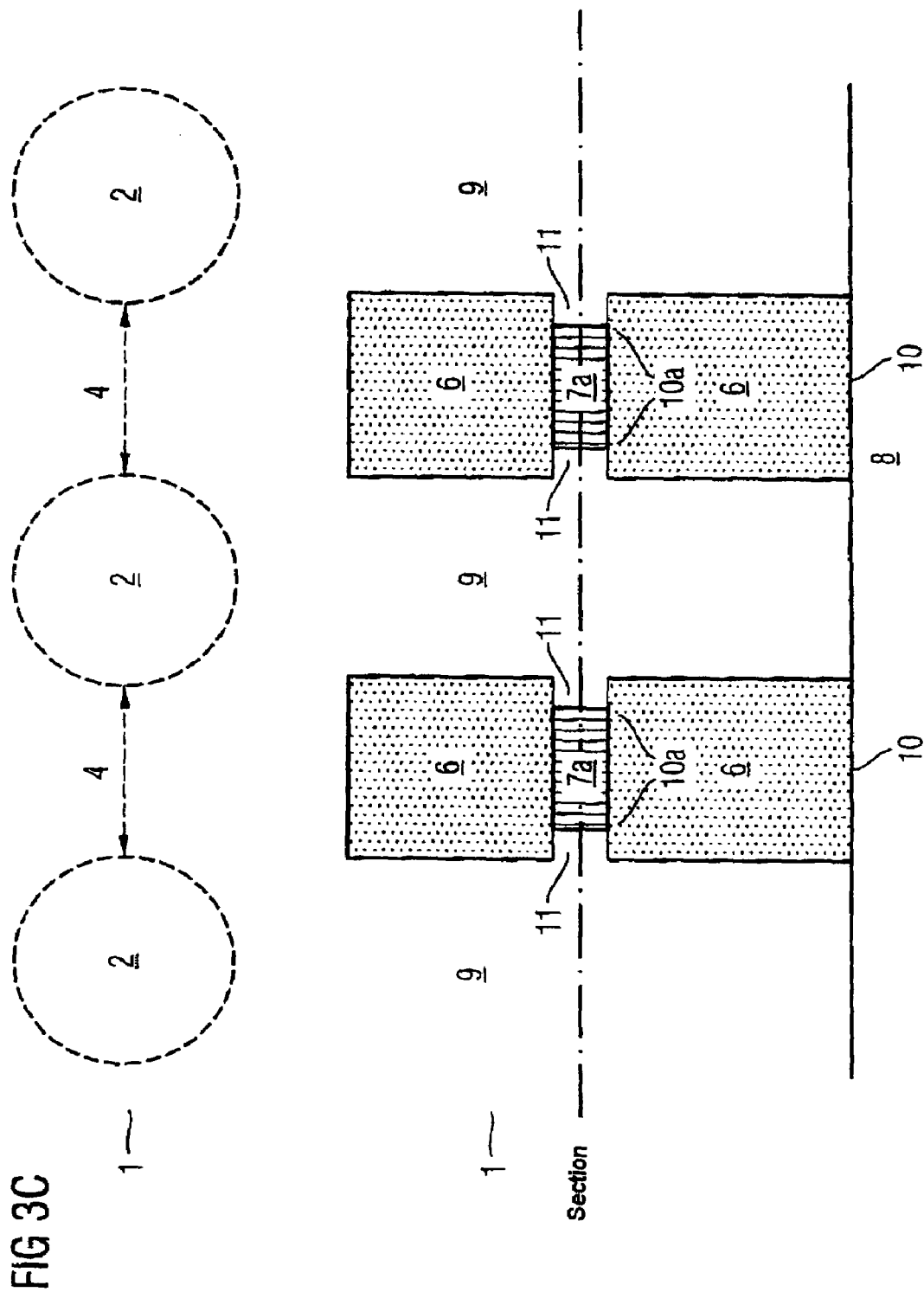

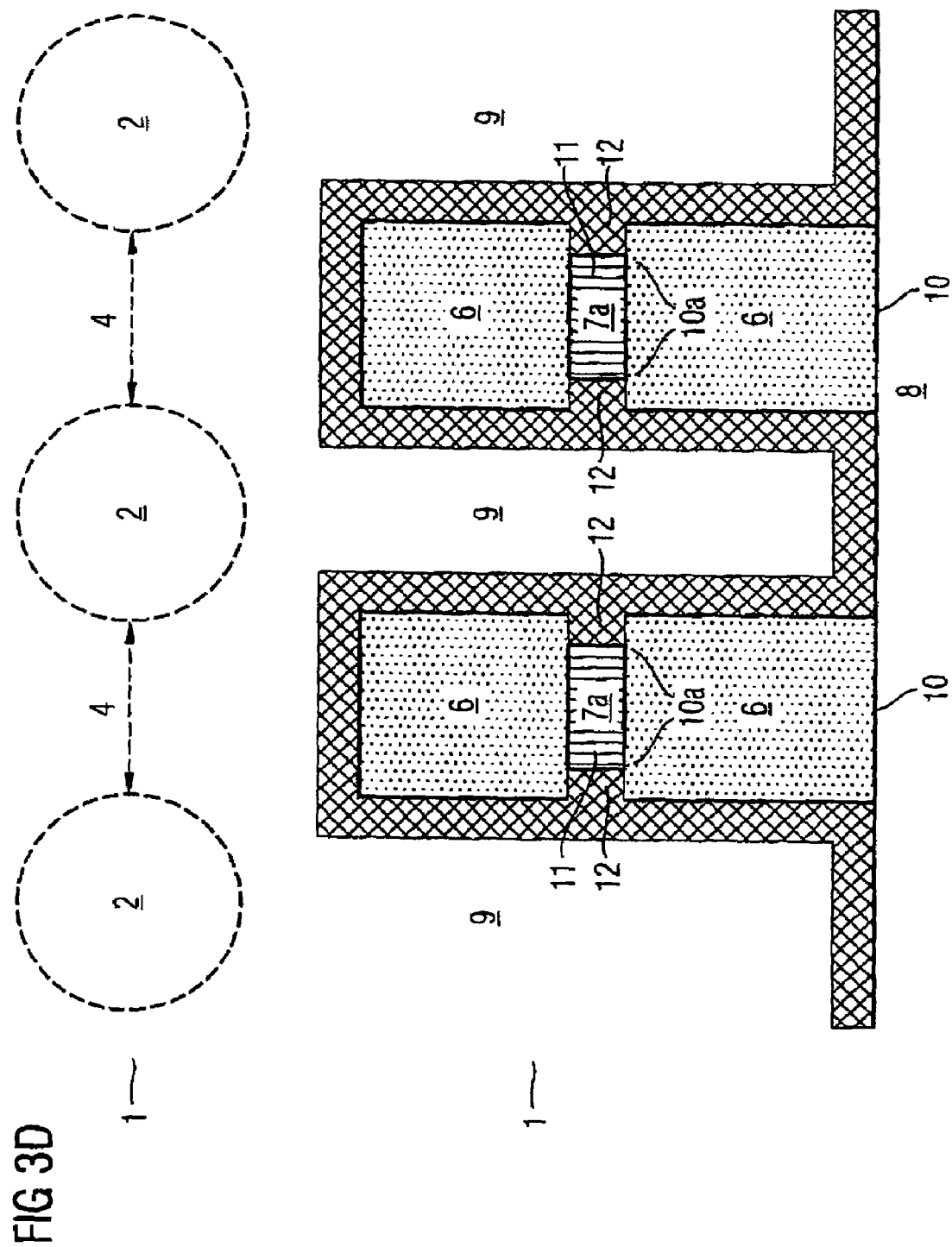

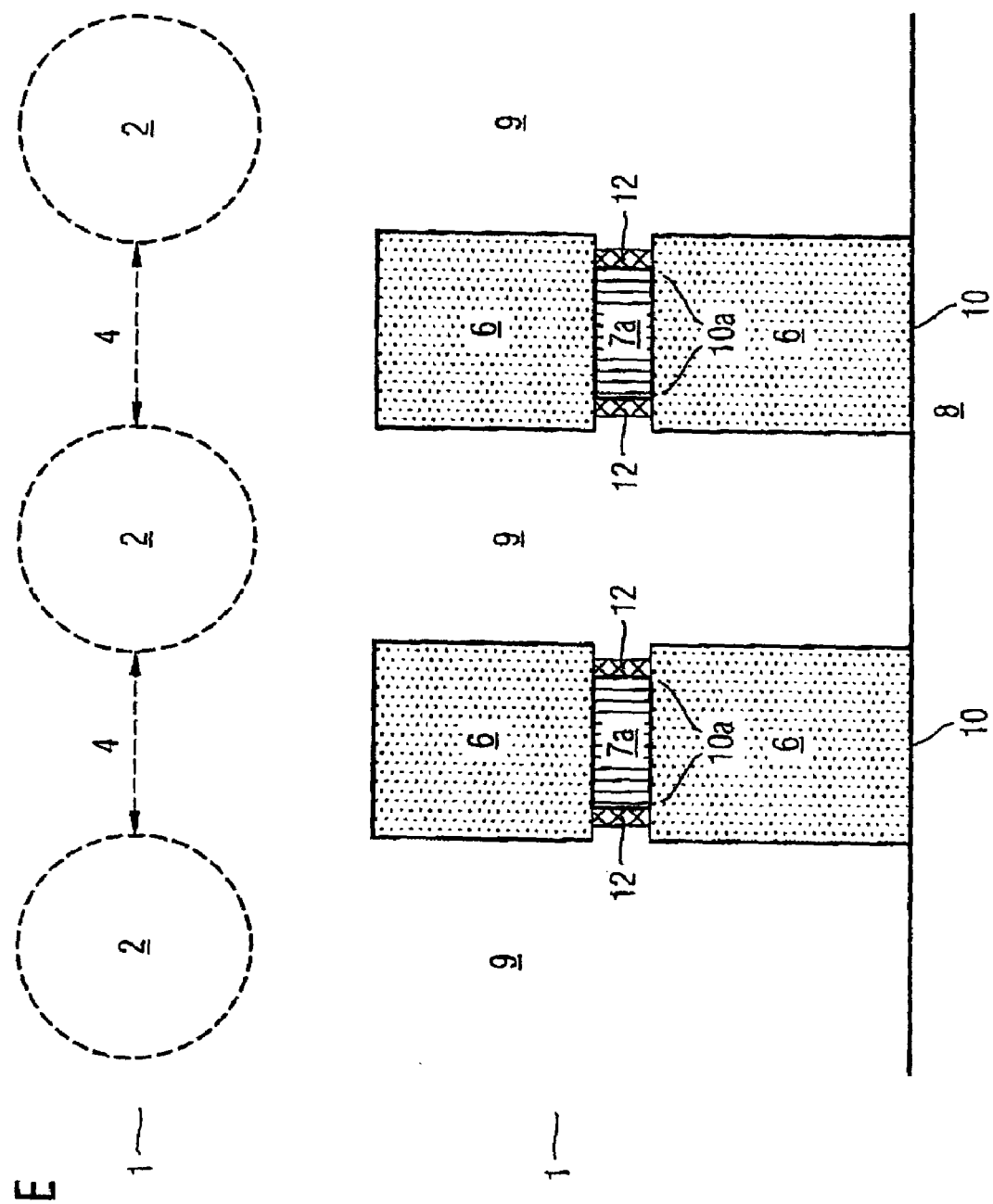

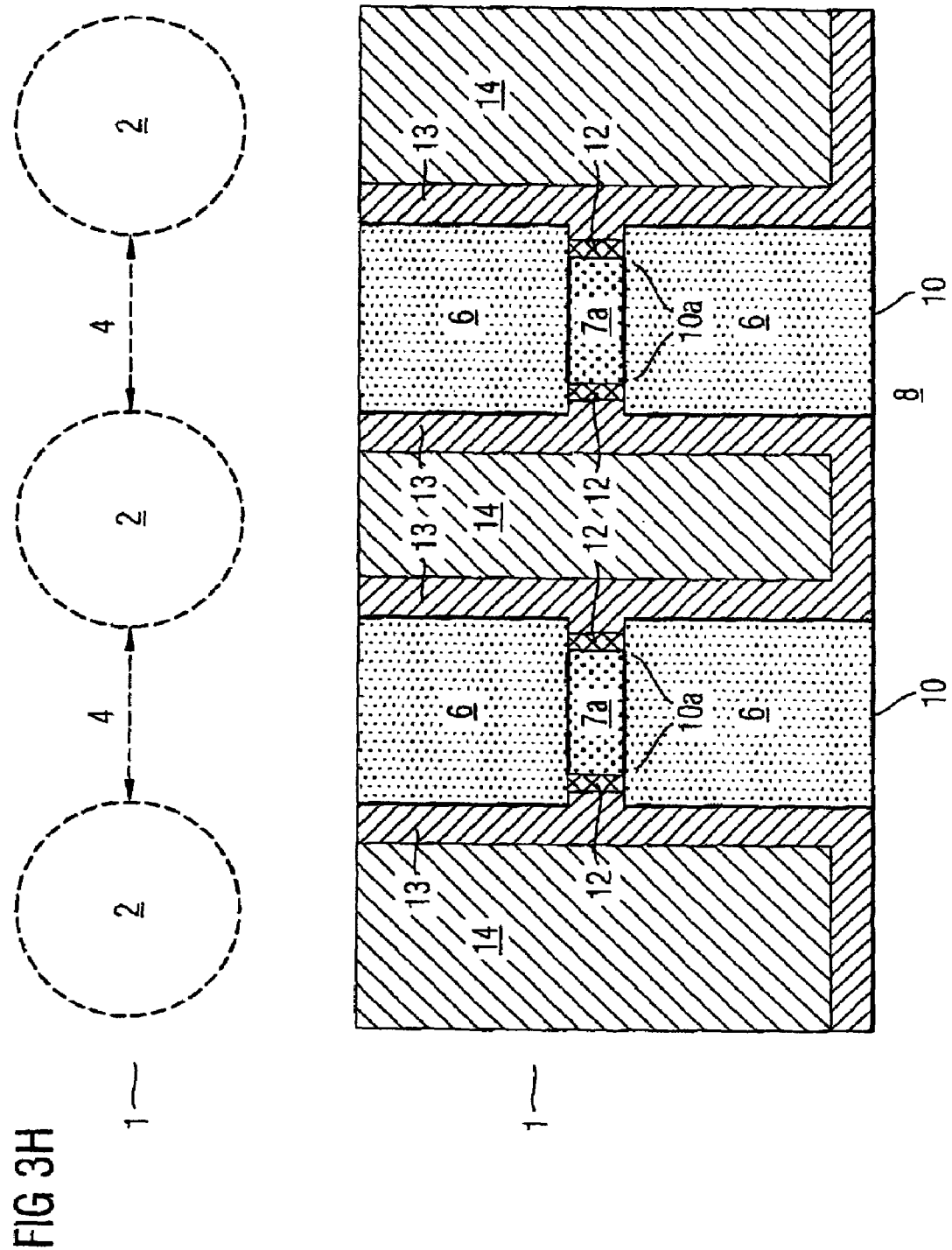

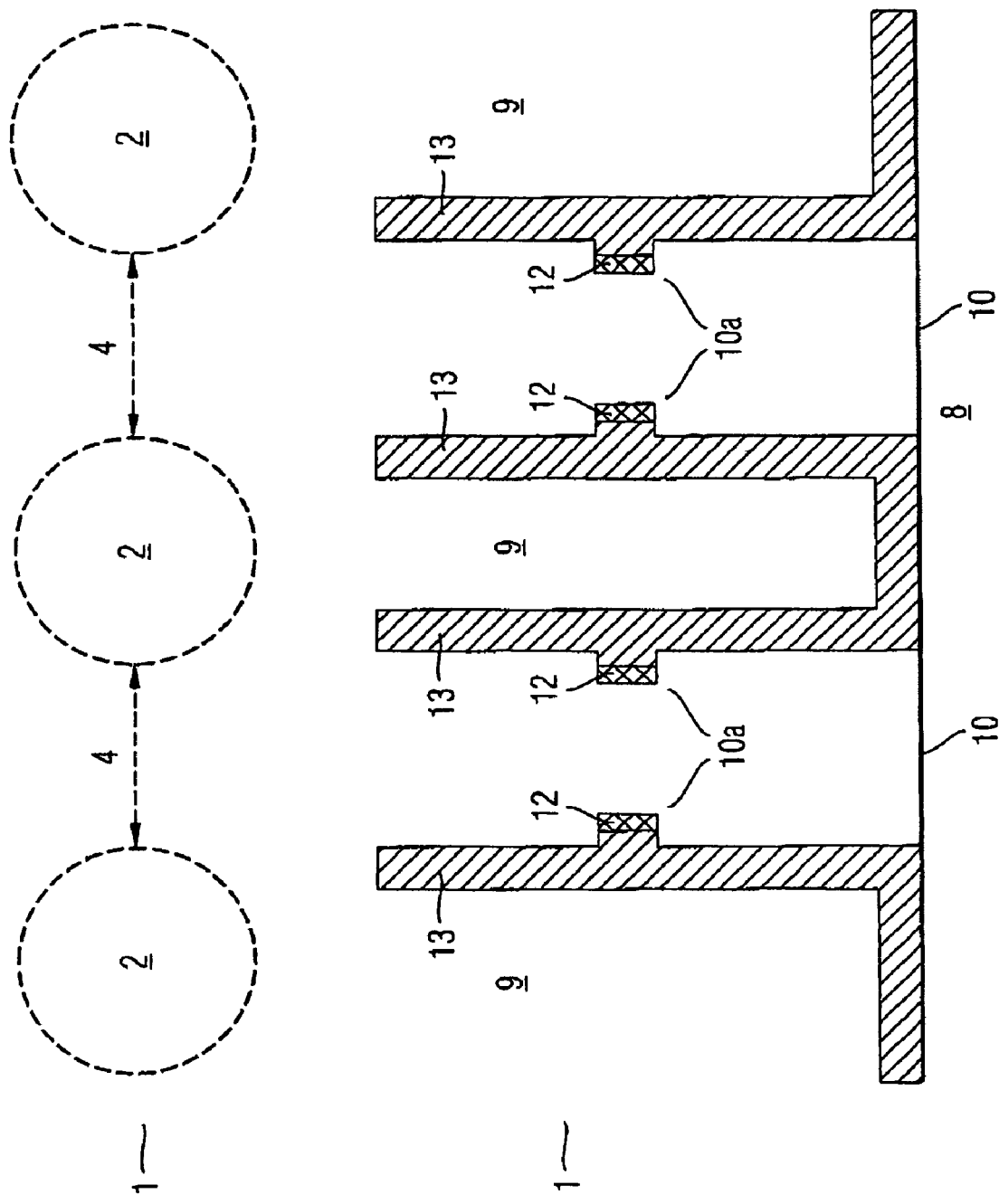

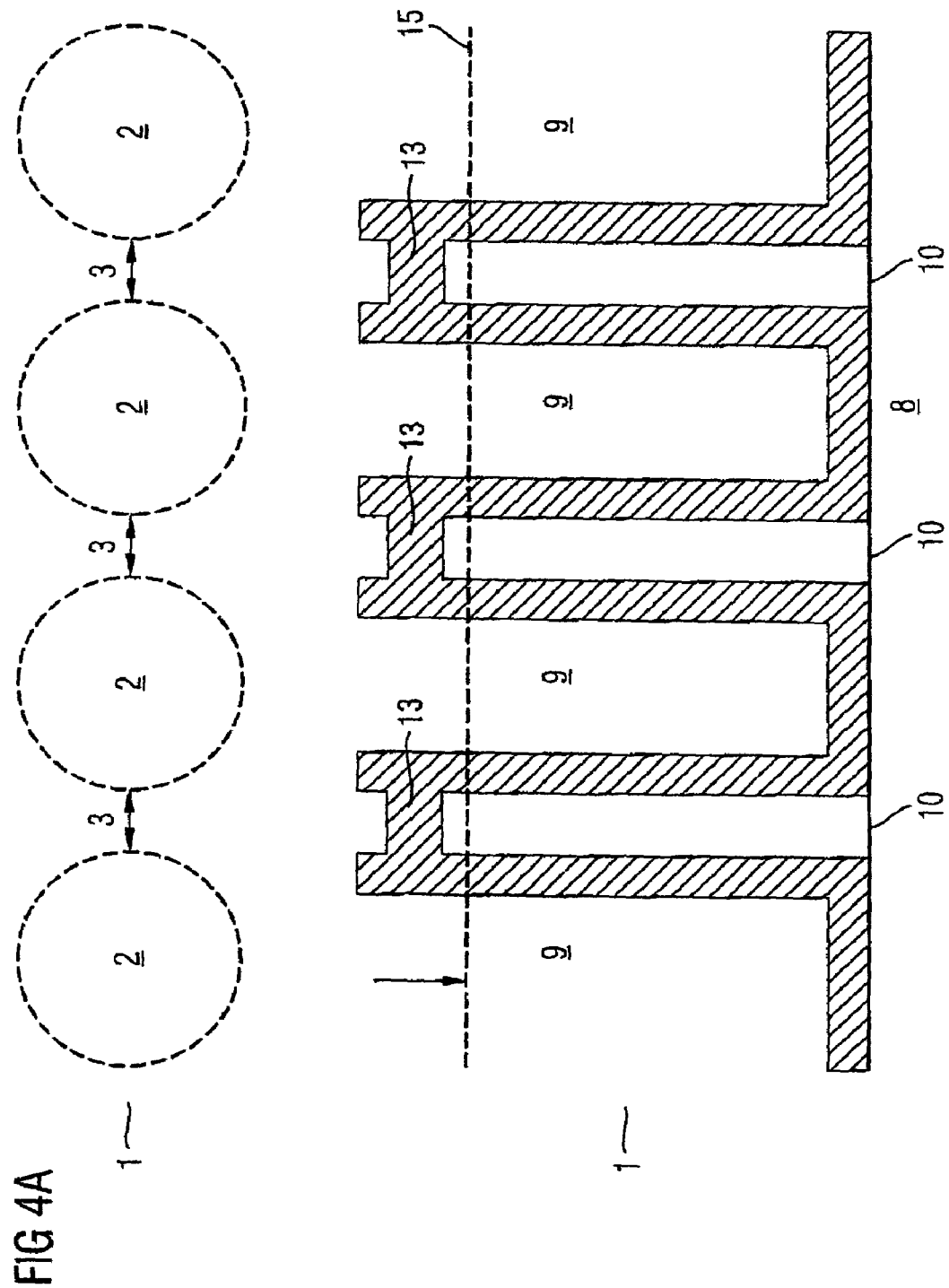

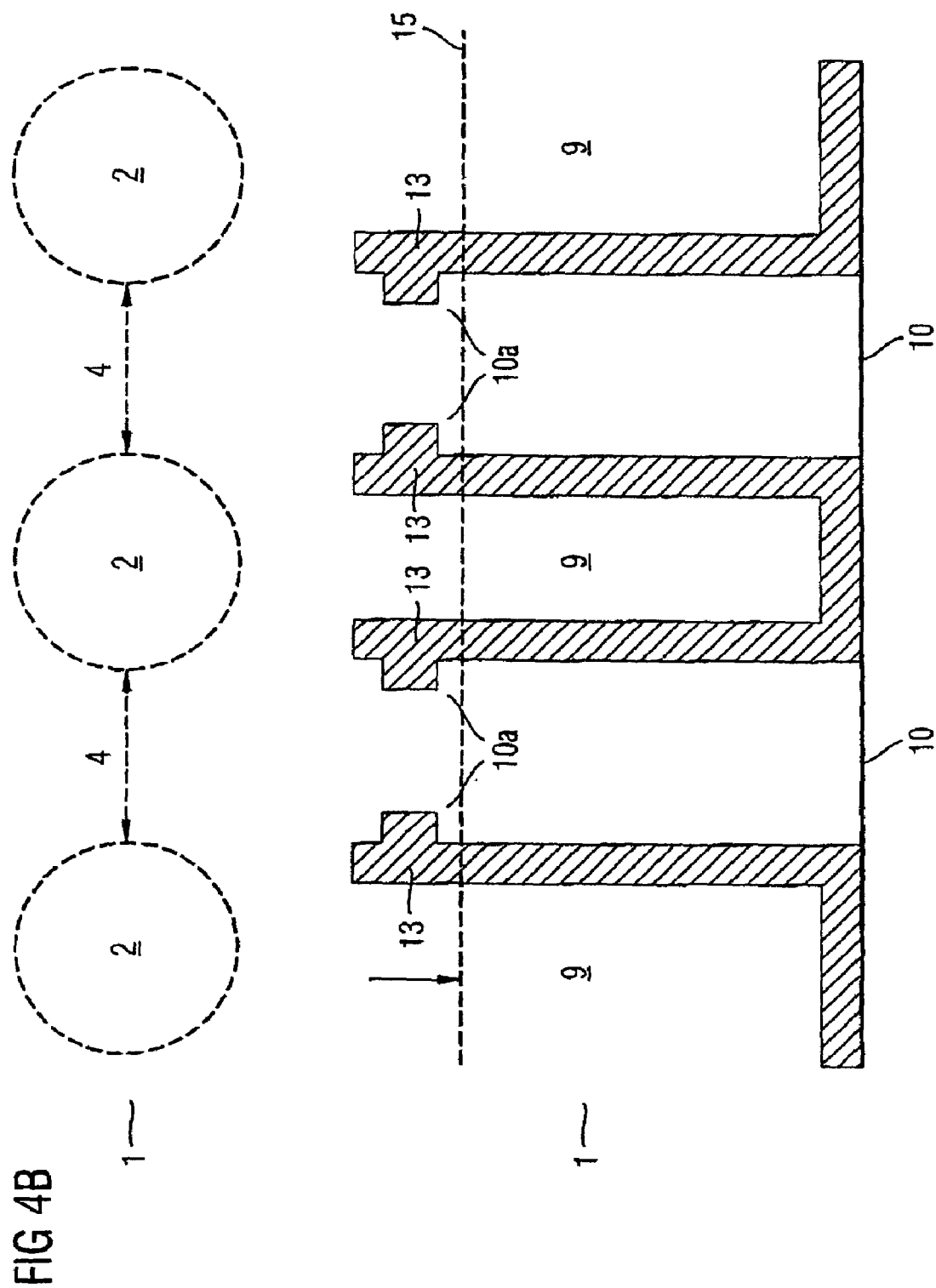

METHOD FOR FABRICATING A STACKED CAPACITOR ARRAY HAVING A REGULAR ARRANGEMENT OF A PLURALITY OF STACKED CAPACITORS

TECHNICAL FIELD

The present invention relates to a method for fabricating a stacked capacitor array having a regular arrangement of a plurality of stacked capacitors.

BACKGROUND ART

Although it can in principle be applied to any desired integrated circuits, the present invention and the problem on which it is based are explained in connection with integrated memory circuits, in particular DRAM cells, produced using silicon technology.

It is known that a stacked capacitor is preferably connected at the bottom to a transistor in order to form a DRAM cell. During the known fabrication of stacked capacitors, in particular of cylindrical stacked capacitors in a stacked capacitor array, the problem arises of the mechanical stability of the individual stacked capacitors decreasing as their aspect ratio increases. If the aspect ratio of capacitors in column or crown form rises above a certain value, the structures become mechanically unstable. The capacitors may disadvantageously adopt an inclination toward one another as a result of this instability. If two adjacent capacitors are inclined toward one another to such an extent that they come into contact with one another, a short circuit is produced between these two capacitors. Memory errors occur within a stacked capacitor array as a result of a short circuit between two capacitors.

Hitherto, this problem has been solved by keeping the aspect ratio of the individual capacitors below an empirically determined limit value. However, this limits the capacitance which can be achieved per capacitor.

However, to further improve the large scale integration of memory circuits, it is necessary to increase the capacitance of the respective capacitor per unit chip surface area by increasing the aspect ratio.

SUMMARY OF THE INVENTION

Therefore, the present invention is based on the object of providing a method for fabricating a stacked capacitor array, so that the stacked capacitors of the stacked capacitor array cannot touch one another.

A further object of the present invention is to improve the mechanical stability of the stacked capacitors with a high aspect ratio.

A further object of the present invention is for the stacked capacitors to be spaced apart from one another by means of a supporting structure, it being possible for the height and position of the supporting structure to be set as desired.

According to the invention, the objects set are achieved by methods for fabricating a stacked capacitor array having a regular arrangement of a plurality of stacked capacitors having the features of Patent claim 1 and Patent claim 2.

On the one hand, the objects set are achieved by the provision of a method for fabricating a stacked capacitor array, which comprises a regular arrangement of a plurality of stacked capacitors, with a stacked capacitor being at a shorter distance from the respectively adjacent stacked capacitor in certain first directions than in certain second directions, with the fabrication method comprising the following method steps: provision of an auxiliary layer stack having first auxiliary layers with a predetermined etching rate and at least one second auxiliary layer with a higher etching rate on a substrate; etching of in each case one hollow cylinder for each stacked capacitor through the auxiliary layer stack in accordance with the regular arrangement, with the auxiliary layer stack being left in place in intermediate regions between the hollow cylinders; isotropic etching of the second auxiliary layers to form widened portions of the hollow cylinders, without any second auxiliary layer being left in place between in each case two hollow cylinders which adjoin one another in the first direction and with a second residual auxiliary layer being left in place between in each case two hollow cylinders which adjoin one another in the second direction; conformal deposition of an insulator layer in order to completely fill the widened portions; deposition of a first electrode layer in the hollow cylinders in order to form the stacked capacitors; filling of the hollow cylinders with a first filling; removal of the first auxiliary layers, the second residual auxiliary layers and the first filling and completion of the stacked capacitor array.

One advantage of the present invention is that the use of the insulator layer means that the individual stacked capacitors are spaced apart from one another, so that individual stacked capacitors cannot come into contact with one another, and therefore short circuits between stacked capacitors are avoided. Moreover, the connection of the individual stacked capacitors improve the mechanical stability of the individual stacked capacitors even with a high aspect ratio. A further particular advantage of the present invention resides in the fact that the height at which the supporting structures or the insulator layer are generated can be set freely as desired by suitable selection of the layer thicknesses and of the number of first and second auxiliary layers of the auxiliary layer stack. Therefore, the position or height of the insulator layer can be varied as desired.

The objects set are also achieved by the provision of a method for fabricating a stacked capacitor array, which comprises a regular arrangement of a plurality of stacked capacitors, with a stacked capacitor being at a shorter distance from the respective adjacent stacked capacitor in certain first directions than in certain second directions, with the fabrication method comprising the following method steps of: provision of an auxiliary layer stack having first auxiliary layers with a predetermined etching rate and at least one second auxiliary layer with a higher etching rate on a substrate; etching of in each case one hollow cylinder for each stacked capacitor through the auxiliary layer stack in accordance with the regular arrangement, with the auxiliary layer stack being left in place in intermediate regions between the hollow cylinders; isotropic etching of the second auxiliary layers to form widened portions of the hollow cylinders, without any second auxiliary layer being left in place between in each case two hollow cylinders which adjoin one another in the first direction and with a second residual auxiliary layer being left in place in each case in a central region between two hollow cylinders which adjoin one another in the second direction; deposition of a first electrode layer in the hollow cylinders, completely filling the widened portions of the hollow cylinders; filling of the hollow cylinders with a first filling, removal of the first auxiliary layers, the second residual auxiliary layers and the first filling; completion of the stacked capacitors and etchback of the stacked capacitors to a level below the widened portions, so that individual stacked capacitors are no longer electrically connected.

A further advantage of the present invention is that it is not imperative that an insulator layer be used to space apart the stacked capacitors if the electrode layer itself serves as a supporting structure and the stacked capacitors are etched back to below the level of the supporting structure after they have been completed.

The subclaims give advantageous refinements and improvements to the fabrication method disclosed in claim 1 and claim 2.

According to one preferred refinement, the auxiliary layer stack has precisely one second auxiliary layer, which has a higher etching rate than the first auxiliary layers.

According to a further preferred refinement, the second auxiliary layer is provided close to the surface, below a thin first auxiliary layer. One advantage of this preferred refinement is that this therefore allows the supporting structure or the insulator layer to be provided very close to the surface.

According to a further preferred refinement, the etching of the hollow cylinders is carried out by means of a dry etching process and/or a wet-chemical etching process.

According to a further preferred refinement, the first auxiliary layers have a predetermined etching rate and the second auxiliary layers have a higher etching rate in comparison thereto.

According to a further preferred refinement, the first auxiliary layers are formed by silicon oxide with a predetermined etching rate, and the second auxiliary layers are formed by silicon oxide with a higher etching rate. Silicon oxide is advantageously easy to etch, making the structure simple to fabricate.

According to a further preferred refinement, the second auxiliary layers are formed by borophosphosilicate glass.

According to a further preferred refinement, the insulator layer is formed by $Si_3N_4$ or by $Al_2O_3$.

According to a further preferred refinement, the electrode layer is formed by polysilicon or by metal.

According to a further preferred refinement, the regular arrangement is in the style of a chessboard, with both the first directions and the second directions in each case being oriented perpendicular to one another.

According to a further preferred refinement, the hollow cylinders are elliptical or rectangular in cross section.

According to a further preferred refinement, the hollow cylinder is formed by a solid cylinder which consists of an electrode material. The solid cylinder is then used as an electrode of the capacitor. One advantage of this preferred refinement is that the fabrication method according to the invention is also suitable for solid cylinders, allowing very large scale integration of the memory circuits. Accordingly, the solid cylinder may be elliptical or rectangular in cross section.

BRIEF DESCRIPTION OF THE DRAWINGS

Exemplary embodiments of the invention are illustrated in the drawings and explained in more detail in the description which follows, in which:

FIGS. 2a–i diagrammatically depict successive method stages involved in a fabrication method as a first embodiment of the present invention, illustrating the stacked capacitors which adjoin one another in first directions;

FIGS. 3b–i diagrammatically depict successive method stages of the fabrication method according to the first embodiment of the present invention, illustrating the stacked capacitors which adjoin one another in second directions; and FIGS. 4a, b in each case diagrammatically depict an intermediate stage of a fabrication method as a second embodiment of the present invention.

DETAILED DESCRIPTION OF THE INVENTION

Figure 1:
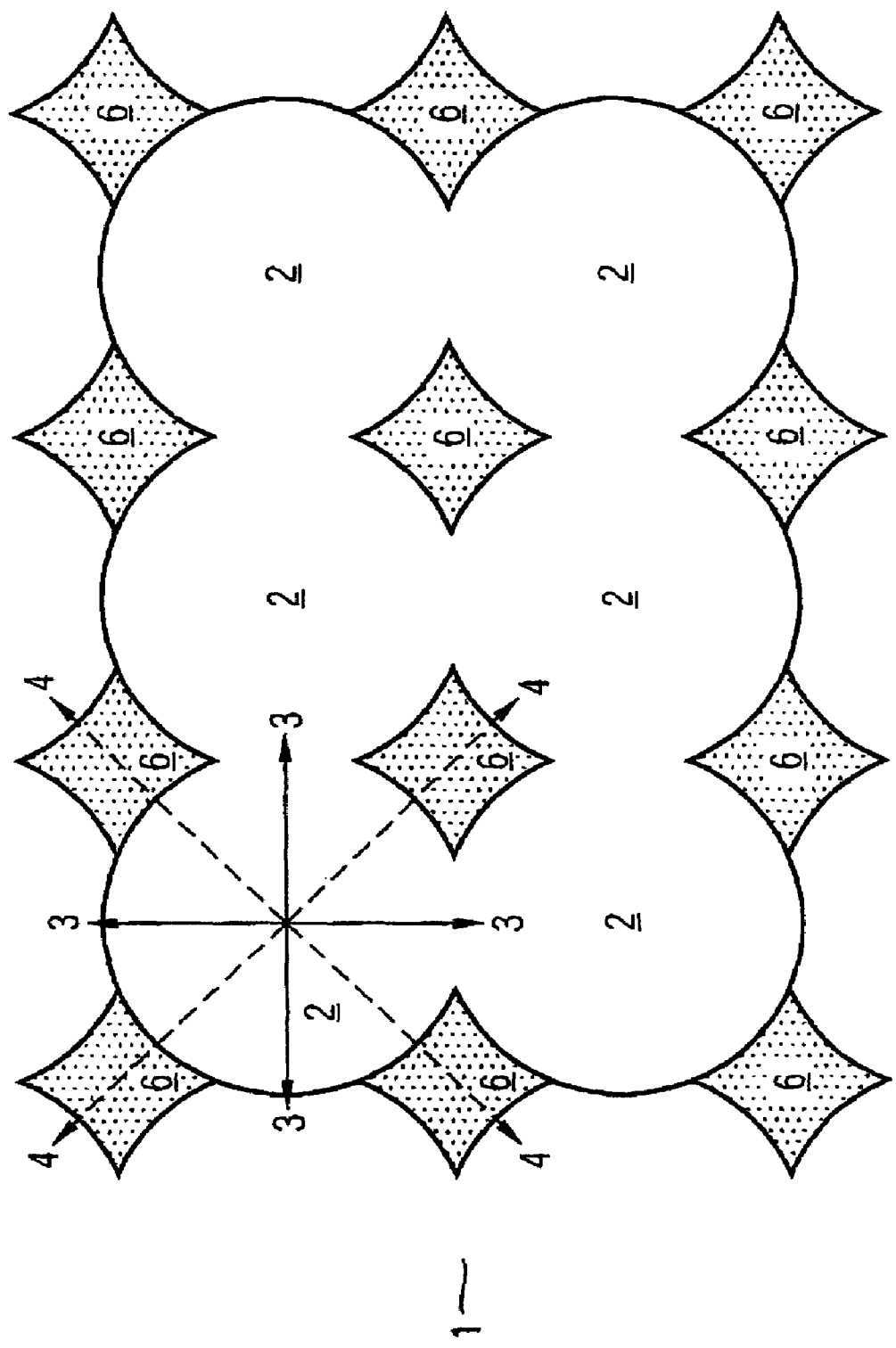
FIG. 1 diagrammatically depicts a cross-sectional view through a stacked capacitor array according to the invention.

In the figures of the drawing, identical or functionally equivalent elements and layers—unless stated otherwise—are provided with the same reference symbols.

FIG. 1 diagrammatically depicts a plan view in cross section of a stacked capacitor array according to the invention. In this figure, reference numeral 1 denotes the stacked capacitor array according to the invention, which has six stacked capacitors 2 in the excerpt which is shown. A stacked capacitor 2 is at a shorter distance from the respectively adjacent stacked capacitors 2 in certain first directions 3 than in certain second directions 4. The regular arrangement of the stacked capacitors 2 in the stacked capacitor array 1 is preferably in the style of a chessboard, with both the first directions 3 and the second directions 4 in each case being oriented perpendicular to one another. The method according to the invention can also be applied to any other regular arrangement.

In the second directions 4, two adjacent stacked capacitors 2 are in each case separated by a first auxiliary layer 6. The method stage illustrated in FIG. 1 corresponds to the method stage illustrated in the corresponding FIGS. 2c and 3c.

Apart from FIG. 1, the upper part of all the figures shows a plan view of the respective method stage used to fabricate a stacked capacitor array 1 according to the invention, while the lower part of each of the figures shows a cross-sectional view of the corresponding method stage.

Figure 2B:
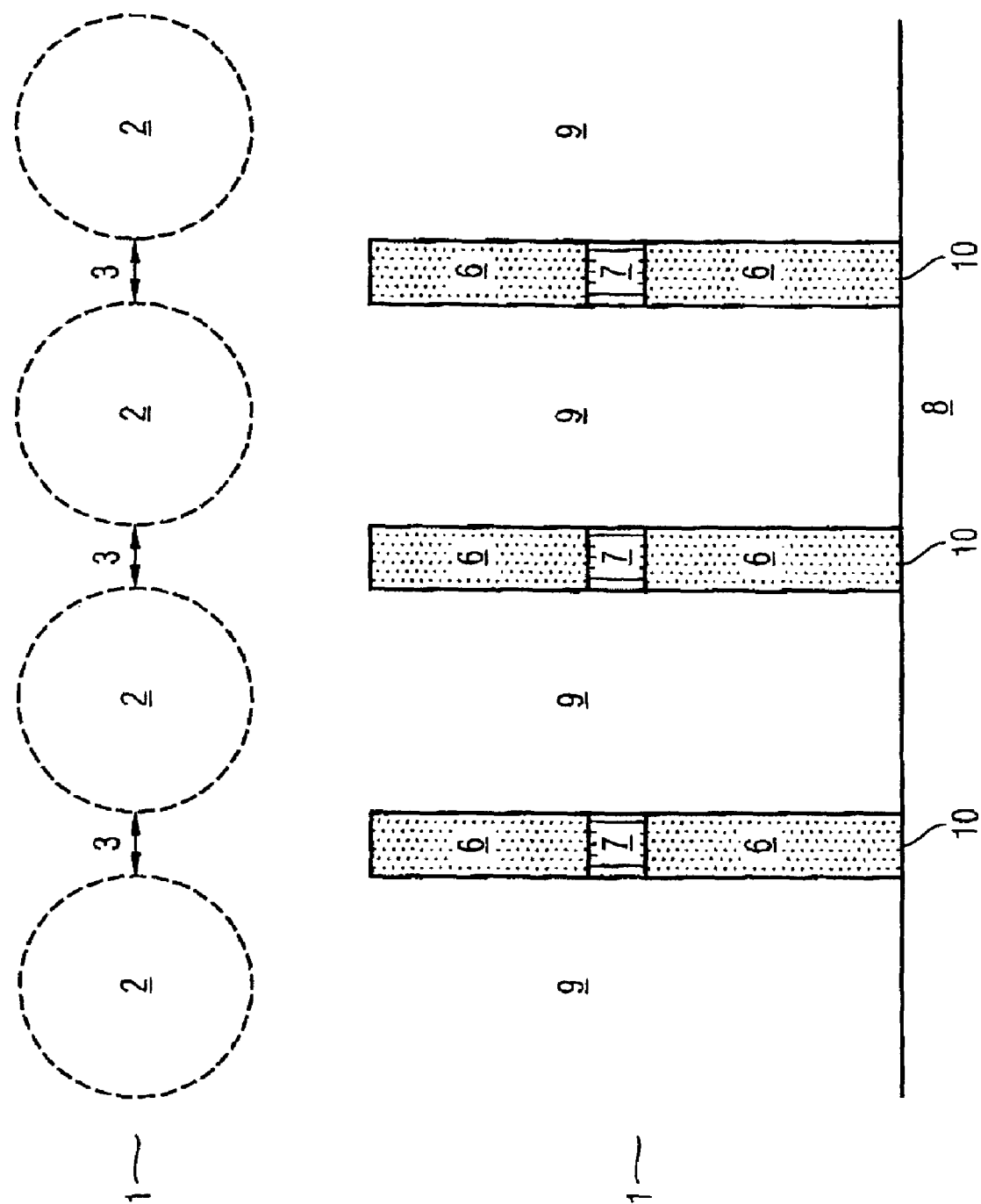

FIGS. 2a to 2e diagrammatically depict successive method stages of a fabrication method as a first embodiment of the present invention, illustrating the stacked capacitors 2 which adjoin one another in first directions 3. FIG. 2a shows the starting stage of the present invention, in which an auxiliary layer stack 5 has been provided on a substrate 8. The auxiliary layer stack 5 comprises a superimposed arrangement of a second auxiliary layer 7 on top of a first auxiliary layer 6. A first auxiliary layer 6 is in turn provided on top of the second auxiliary layer 7.

Analogously to FIGS. 2b–i, FIGS. 3b–i show diagrammatic illustrations of successive method stages involved in a fabrication method of the first embodiment of the present invention, illustrating the stacked capacitors 2 arranged in second directions 4.

FIG. 2b shows the method stage which follows FIG. 2a, illustrated in the first directions 3. FIG. 3b likewise shows the method stage which follows FIG. 2a, but illustrated in the second directions 4. FIGS. 2b and 3b illustrate that in each case one hollow cylinder 9 for each stacked capacitor 2 is etched through the auxiliary layer stack 5 in accordance with the regular arrangement (cf. FIG. 1), with the auxiliary layer stack 5 being left in place in intermediate regions 10 between the hollow cylinders 9.

FIGS. 2c and 3c show that the second auxiliary layers 7 are etched back to form widened portions 11 of the hollow cylinders 9, without any auxiliary layer 7 being left in place between in each case two hollow cylinders 9 which adjoin one another in the first direction 3 (FIG. 2c) but with a second residual auxiliary layer 7a being left in place in each case between two hollow cylinders 9 which adjoin one another in the second direction 4 (FIG. 3c). The etching process is isotropic and carried out until there is no longer any second auxiliary layer 7 in the intermediate regions 10 in the first directions 3.

Then, referring now to FIGS. 2d and 3d, an insulator layer 12 is deposited conformally so as to completely fill the widened portions 11 of the hollow cylinders 9. Conformal deposition of the insulator layer 12 is required, since holes or voids in the insulator layer 12 within the widened portions 11 are to be avoided. The thickness of the insulator layer 12 which is to be deposited is at least half the height of the removed second auxiliary layer 7, so that the widened portions 11 are completely filled.

Referring now to FIG. 3d, it should be noted that the widened portions 11 are filled with the second residual auxiliary layer 7a in a central region 10a of the intermediate regions 10 and with the insulator layer 12 in the remaining regions of the intermediate regions 10.

Figure 2E:
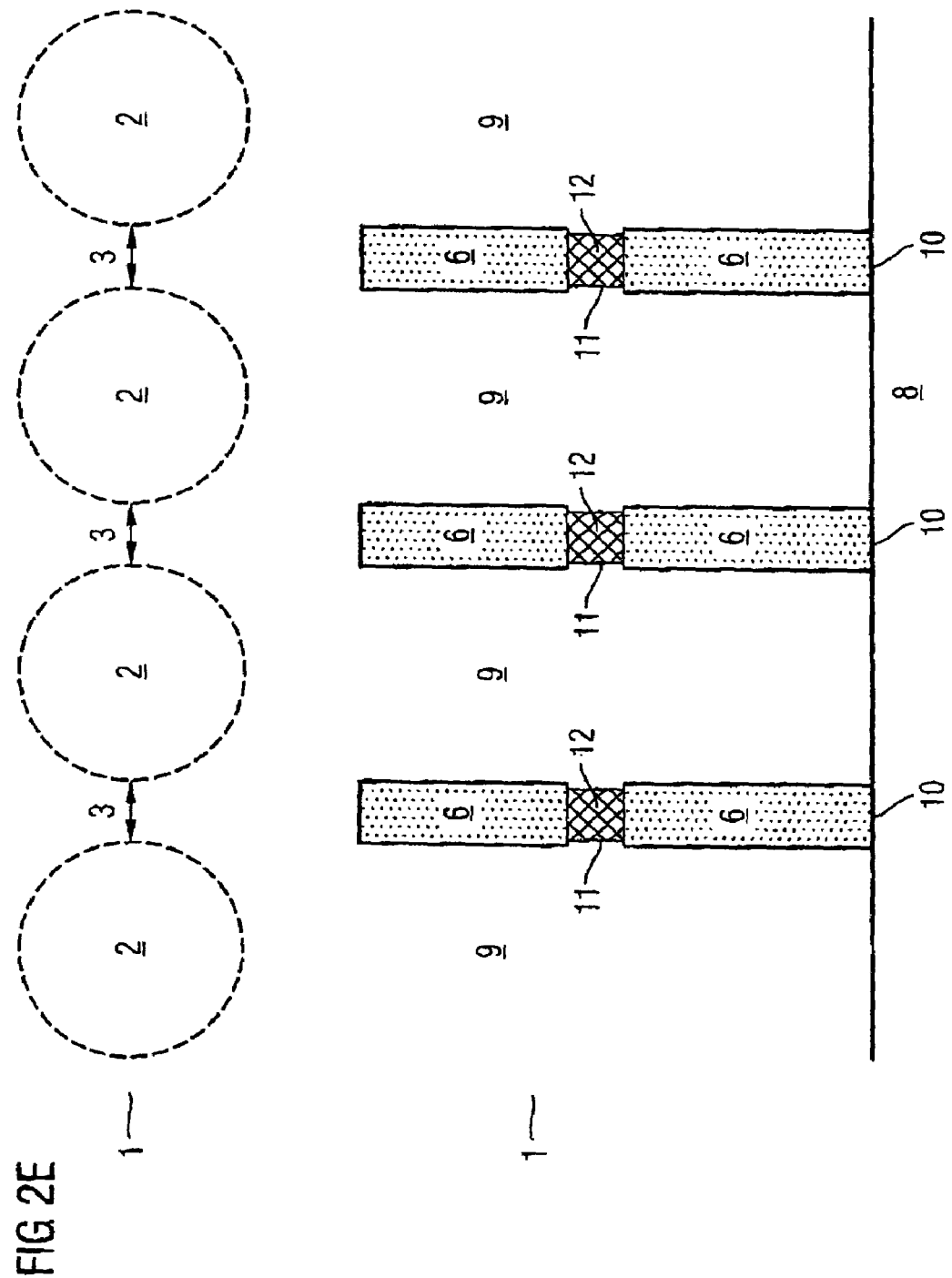

FIGS. 2e and 3e illustrate that excess material in the insulator layer 12 which has been deposited within the hollow cylinders 9 is removed by means of an etchback process.

Figure 3F:
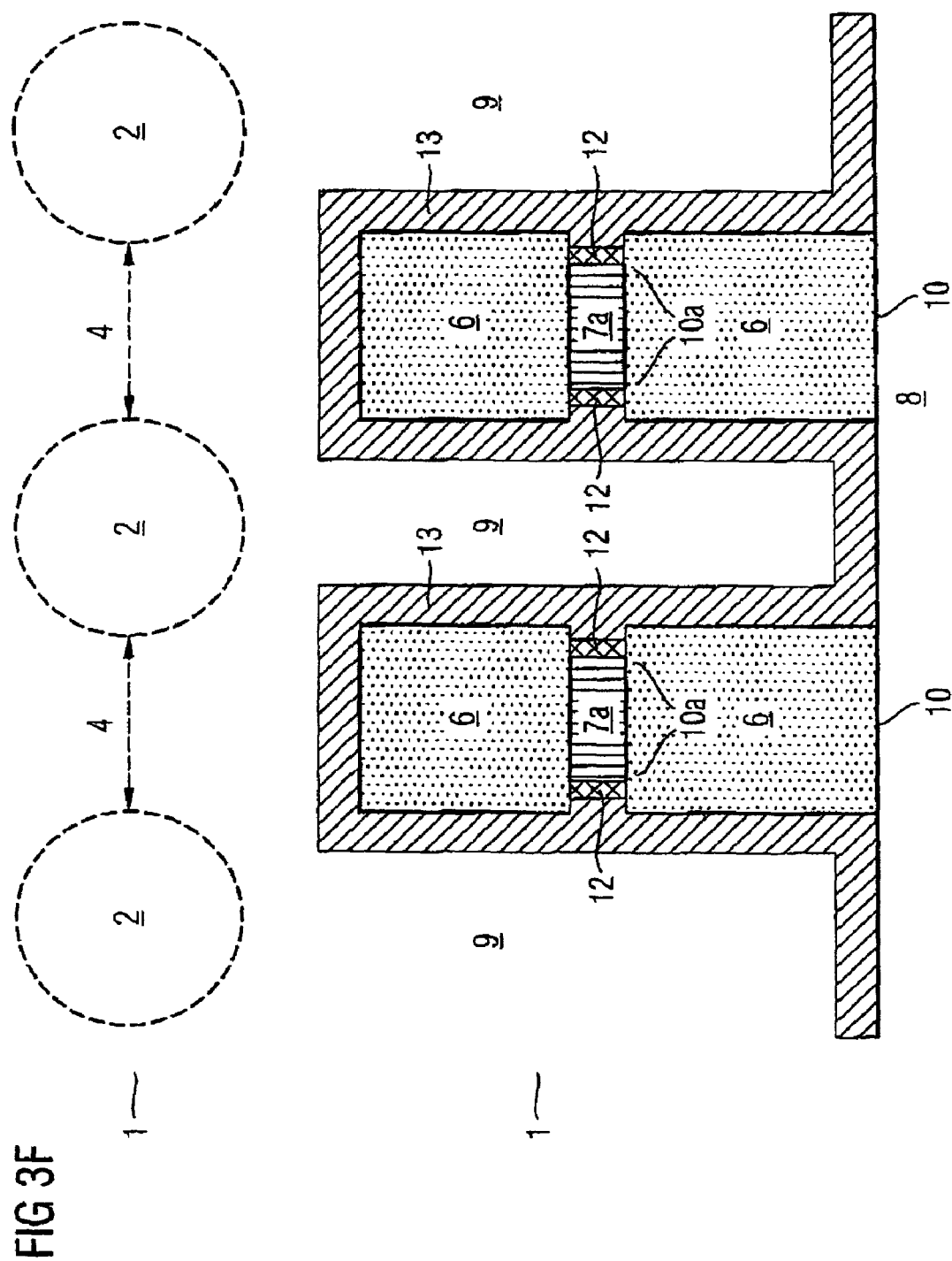

Referring now to FIGS. 2f and 3f, a first electrode layer 13 is deposited in the hollow cylinders 9 in order to form the stacked capacitors 2. It should be noted that according to the invention it is not necessary for the first electrode layer 13 to be deposited over the intermediate regions 10, but it is generally inevitable that this will happen for process engineering reasons.

Figure 3G:
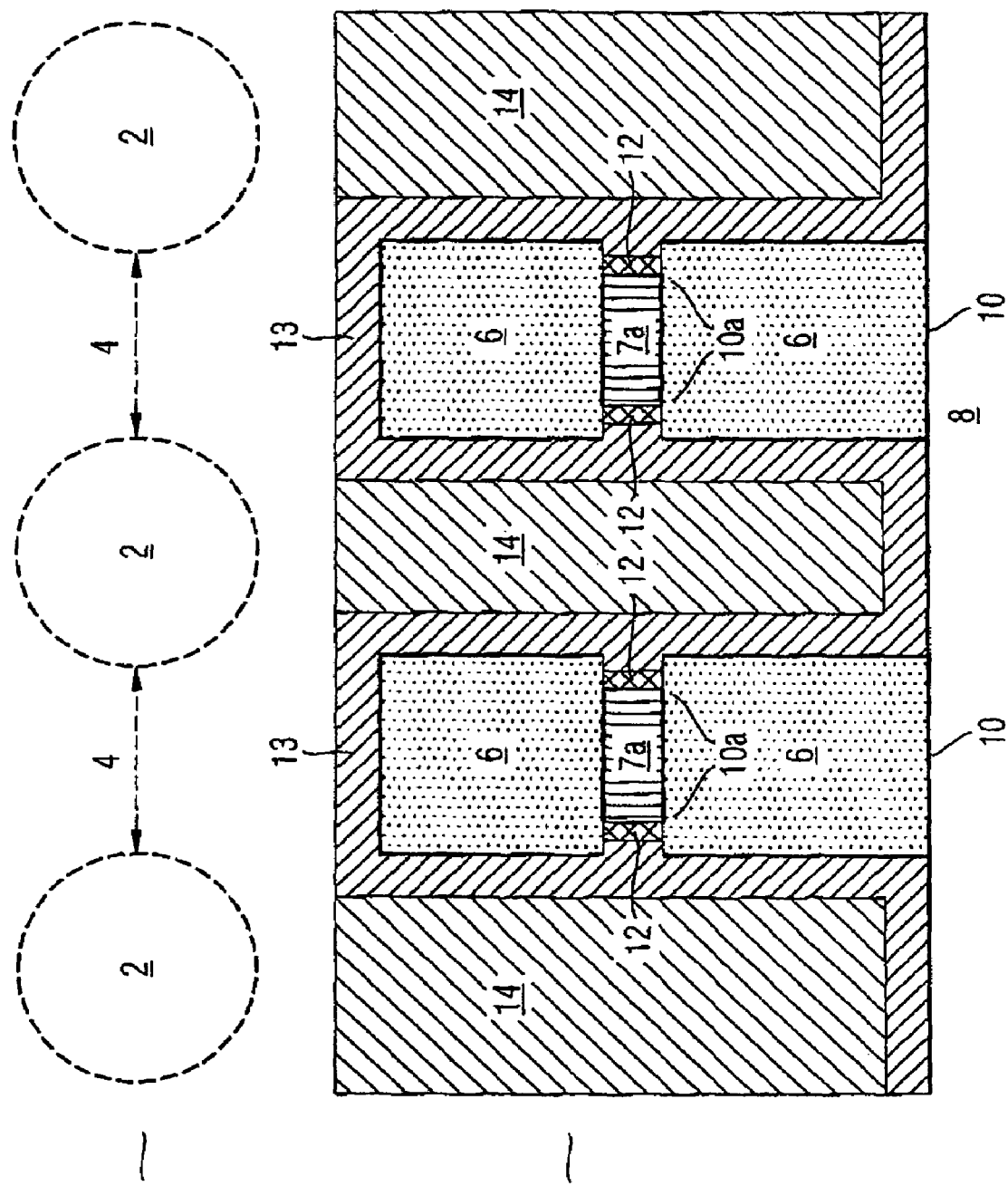

FIGS. 2g and 3g show that a first filling 14 is deposited over the first electrode layer 13 in the hollow cylinders 9. The first filling 14 serves as an auxiliary layer.

It is preferable for the electrode layer 13 to be formed by polysilicon or by a metal.

Since the first electrode layer 13 has also been deposited over the intermediate regions 10, it is removed there by means of chemical mechanical polishing or an etchback process, cf. FIGS. 2h and 3h. Therefore, the individual stacked capacitors 2 are no longer electrically connected.

It is then possible for all the auxiliary layers, namely the first auxiliary layers 6, the second residual auxiliary layers 7a and the first filling 14, to be removed by means of an etching process. FIG. 3i illustrates that when the second residual auxiliary layer 7a has been removed, the first auxiliary layer 6 beneath it can also be removed. The regions of the first auxiliary layers 6 which are located in the first directions 3 are also removed by means of these holes, which are formed through the removal of the second residual auxiliary layers 7a. FIG. 2i illustrates that said regions of the first auxiliary layer 6 which have been applied to the substrate 8 have been removed and that the first electrode layers 13 of two stacked capacitors which adjoin one another in the first direction 3 are connected by means of the insulator layer 12.

The connection of two stacked capacitors 2 by means of the insulator layer 12 forms the supporting structure which spaces the individual stacked capacitors apart from one another and improves the stability of the stacked capacitors, which may have even a very high aspect ratio.

FIGS. 4a and 4b in each case diagrammatically depict an intermediate stage of a fabrication method as a second embodiment of the present invention. FIG. 4a illustrates the stacked capacitors 2 which adjoin one another in first directions 3, whereas FIG. 4b illustrates the stacked capacitors 2 which adjoin one another in second directions 4.

FIGS. 4a and 4b illustrate an intermediate stage for fabrication of a stacked capacitor array 1 according to the invention after the following method steps. An auxiliary layer stack 5 comprising first auxiliary layers 6 with a predetermined etching rate and at least one second auxiliary layer 7 with a higher etching rate was provided on a substrate 8. Then, in each case one hollow cylinder 9 for each stacked capacitor 2 was etched through the auxiliary layer stack 5 in accordance with the regular arrangement, with the auxiliary layer stack 5 being left in place in intermediate regions 10 between the hollow cylinders 9. From this, the second auxiliary layers 7 were etched back isotropically to form widened portions of the hollow cylinders 9, without any second auxiliary layer 7 being left in place between in each case two hollow cylinders 9 which adjoin one another in the first direction 3 and with a second residual auxiliary layer 7a being left in place in a central region 10a of the intermediate regions 10 in each case between two hollow cylinders 9 which adjoin one another in the second direction 4 (cf. FIGS. 2a to 2c and FIGS. 3a to 3c). Then, referring now to FIGS. 4a and 4b, a first electrode layer 13 is deposited in the hollow cylinders 9, with the widened portions of the hollow cylinders being completely filled with the electrode layer 13 (not shown). The hollow cylinders 9 are filled with a first filling 14 (not shown). The electrode layer 13 is removed above the intermediate regions 10, and then all the auxiliary layers (6, 7a, 14) can be removed (cf. FIGS. 2i and 3i and the associated description). The stacked capacitors 2 are then completed (not shown). Openings or holes which may potentially be present are optionally filled by means of a further auxiliary layer, e.g. with a dielectric, so that the mechanical stability of the stacked capacitor array 1 is increased further. Finally, the stacked capacitors 2 are then etched back to a level 15 below the widened portions 11, so that individual stacked capacitors 2 are not electrically connected. It is then possible to provide any desired supporting structure in the intermediate regions 10. Since the stacked capacitors 2 have already been completed and therefore their mechanical stability is ensured, it is optionally also possible to dispense with any supporting structure.

Although the present invention has been described above on the basis of preferred exemplary embodiments, it is not restricted to these embodiments, but rather can be modified in various ways. For example, the choice of materials for the layers used is only an example, and many other materials are conceivable and may be employed.

List of Reference Symbols

1 Stacked capacitor array
2 Stacked capacitor
3 First directions
4 Second directions
5 Auxiliary layer stack
6 First auxiliary layer
7 Second auxiliary layer
7a Second residual auxiliary layer
8 Substrate
9 Hollow cylinder
10 Intermediate region
10a Middle region of the intermediate region
11 Widened portions
12 Insulator layer
13 Electrode layer
14 First filling
15 Level

What is claimed is:

1. Method for fabricating a stacked capacitor array, which comprises a regular arrangement of a plurality of stacked capacitors, with a stacked capacitor being at a shorter distance from the respectively adjacent stacked capacitor in certain first directions than in certain second directions, comprising the following method steps:
    (a) providing of an auxiliary layer stack having first auxiliary layers with a predetermined etching rate and at least one second auxiliary layer with a higher etching rate on a substrate;
    (b) etching of in each case one hollow cylinder for each stacked capacitor through the auxiliary layer stack in accordance with the regular arrangement, with the auxiliary layer stack being left in place in intermediate regions between the hollow cylinders;
    (c) etching isotrophically of the second auxiliary layers to form widened portions of the hollow cylinders, without any second auxiliary layer being left in place between in each case two hollow cylinders which adjoin one another in the first direction and with a second residual auxiliary layer being left in place between in each case two hollow cylinders which adjoin one another in the second direction;
    (d) depositing conformally of an insulator layer in order to completely fill the widened portions;
    (e) depositing of a first electrode layer in the hollow cylinders in order to form the stacked capacitors;
    (f) filling of the hollow cylinders with a first filling;
    (g) removing of the first auxiliary layers, the second residual auxiliary layers and the first filling; and
    (h) completing of the stacked capacitor array.

2. Method for fabricating a stacked capacitor array, which comprises a regular arrangement of a plurality of stacked capacitors, with a stacked capacitor being at a shorter distance from the respectively adjacent stacked capacitor in certain first directions than in certain second directions, comprising the following method steps:
    (a) providing of an auxiliary layer stack having first auxiliary layers with a predetermined etching rate and at least one second auxiliary layer with a higher etching rate on a substrate;
    (b) etching of in each case one hollow cylinder for each stacked capacitor through the auxiliary layer stack in accordance with the regular arrangement, with the auxiliary layer stack being left in place in intermediate regions between the hollow cylinders;
    (c) etching isotrophically of the second auxiliary layers to form widened portions of the hollow cylinders, without any second auxiliary layer being left in place between in each case two hollow cylinders which adjoin one another in the first direction and with a second residual auxiliary layer being left in place in each case in a central region between two hollow cylinders which adjoin one another in the second direction;
    (d) depositing of a first electrode layer in the hollow cylinders, completely filling the widened portions of the hollow cylinders;
    (e) filling of the hollow cylinders with a first filling;
    (f) removing of the first auxiliary layers, the second residual auxiliary layers and the first filling;
    (g) completing of the stacked capacitors; and
    (h) etching back of the stacked capacitors to a level below the widened portions, so that individual stacked capacitors are no longer electrically connected.

3. Method according to claim 1, wherein the auxiliary layer stack has precisely one single second auxiliary layer.

4. Method according to claim 3, wherein the single second auxiliary layer is provided close to the surface, below a thin first auxiliary layer.

5. Method according to claim 1, wherein the etching of the hollow cylinders is carried out by means of a dry etching process and/or a wet-chemical etching process.

6. Method according to claim 1, wherein the first auxiliary layers have a predetermined etching rate and the second auxiliary layers have a higher etching rate in comparison thereto.

7. Method according to claim 1, wherein the first auxiliary layers are formed by silicon oxide with a predetermined etching rate, and the second auxiliary layers are formed by silicon oxide with a higher etching rate.

8. Method according to claim 1, wherein the second auxiliary layers are formed by borophosphosilicate glass.

9. Method according to claim 1, wherein the insulator layer is formed by $Si_3N_4$ or by $Al_2O_3$.

10. Method according to claim 1, wherein the electrode layer is formed by polysilicon or by metal.

11. Method according to claim 1, wherein the regular arrangement is of a chessboard-like design, with both the first directions and the second directions in each case being perpendicular to one another.

12. Method according to claim 1, wherein the hollow cylinder is elliptical or rectangular in cross section.

13. Method according to claim 1, wherein the hollow cylinder is formed by a solid cylinder which consists of an electrode material.

* * * * *